United States Patent [19]

Gribnikov et al.

[11] Patent Number: 5,461,245
[45] Date of Patent: Oct. 24, 1995

[54] ARTICLE COMPRISING A BIPOLAR TRANSISTOR WITH FLOATING BASE

[75] Inventors: Zinovy S. Gribnikov, Kiev, Russian Federation; Serge Luryi, Bridgewater, N.J.

[73] Assignee: AT&T Corp., Murray Hill, N.J.

[21] Appl. No.: 295,303

[22] Filed: Aug. 24, 1994

[51] Int. Cl.[6] .......................... H01L 29/24; H01L 29/161
[52] U.S. Cl. ........................... 257/197; 257/566; 257/586
[58] Field of Search .................................... 257/574, 197, 257/198, 183, 580, 579, 586, 575, 83, 187, 462, 566

[56] References Cited

U.S. PATENT DOCUMENTS

| | | | |
|---|---|---|---|
| 4,999,687 | 3/1991 | Luryi et al. | 357/16 |
| 5,006,912 | 4/1991 | Smith et al. | 257/197 |
| 5,315,135 | 5/1994 | Ueda | 257/198 |

FOREIGN PATENT DOCUMENTS

| | | | |
|---|---|---|---|
| 61-222166 | 10/1986 | Japan | 257/197 |
| 1-297860 | 11/1989 | Japan | 257/197 |
| 4-96274 | 3/1992 | Japan | 257/197 |

OTHER PUBLICATIONS

"Charge Injection Logic", by S. Luryi, *Applied Physics Letters*, 57 (17), 22 Oct. 1990, pp. 1787–1789.

*Primary Examiner*—Jerome Jackson
*Assistant Examiner*—John Guay
*Attorney, Agent, or Firm*—Eugen E. Pacher

[57] ABSTRACT

The novel bipolar transistor has at least two separated emitter contacts and no base contact, and the emitter/base p-n junction has backward diode characteristics. The transistor can function as a logic device, but can also function as an amplifying device in digital or analog circuits.

11 Claims, 2 Drawing Sheets

ARTICLE COMPRISING A BIPOLAR TRANSISTOR WITH FLOATING BASE

FIELD OF THE INVENTION

This invention pertains to the field of bipolar transistors.

BACKGROUND OF THE INVENTION

Prior art bipolar transistors are three-terminal devices that require, in addition to emitter and collector contacts, a base contact. The base contact occupies area on an integrated circuit chip, and processing steps are required to provide the base contact. Clearly, it would be advantageous to have available a bipolar transistor that does not have a separate base contact. Furthermore, it would be advantageous to have available a bipolar transistor that can perform logic tasks that normally require a multiplicity of prior art transistors. This application discloses such a bipolar transistor.

U.S. Pat. No. 4,999,687 discloses a real space transfer (RST) device that can perform logic tasks that normally require a multiplicity of conventional transistors. The structure of an RST device differs from the structure of a bipolar transistor. See also S. Luryi et al., *Applied Physics Letters*, Vol. 57, p. 1787 (1990).

SUMMARY OF THE INVENTION

The invention is generally embodied in an article that comprises a novel semiconductor device. The device comprises a semiconductor layer structure that can be substantially like that of a conventional bipolar transistor. Specifically, the layer structure is typically disposed on a semiconductor substrate and comprises, in sequence, a first, a second and a third semiconductor layer. The first layer has a first composition and is doped to be of a first conductivity type (e.g., n-type). The second layer has second composition that differs from the first composition, and is doped to be the second conductivity type (e.g., p-type). The third layer has a third composition different from the second composition but not necessarily different from the first composition, and is doped to be the first conductivity type. The device also comprises a first contact for electrically contacting the first layer, and a further contact for electrically contacting the third layer. The first, second and third layers will be referred to as the collector, base and emitter layers, respectively, and the first contact as the collector contact.

Significantly, the emitter layer comprises a first region and a second region that is essentially electrically isolated from the first region such that substantially no first conductivity type charge carriers (e.g., electrons) can flow between said first and second regions without passing through base layer material. The further contact comprises a first region contact that is disposed on the first region emitter layer, and further comprises a second region contact that is disposed on the second region of the emitter layer and that is not in direct contact with the first region contact. Furthermore, the device is adapted for operation without contact to the base layer.

The first and second emitter regions will be referred to as emitter 1 and emitter 2, respectively, and the first and second emitter contacts as emitter 1 contact and emitter 2 contact, respectively. The inventive device is not limited to two emitter regions only, and may comprise 3 (possibly even more) emitter regions. Exemplarily the collector, base and emitter layers are Si, $Si_xGe_{1-x}$, and Si, respectively, but the device can also readily be implemented with compound semiconductors, e.g., GaAsSb/InAlAs heterostructure lattice-matched to InP. Notation such as "InAlAs" is conventional and does not imply that the material contains equal molar amounts of In, Al and As. The device can be readily manufactured, typically requiring only known manufacturing techniques. Doping levels of the collector and base can be conventional, but the emitter layer will typically be doped to a somewhat higher level than is conventional in prior art bipolar transistors. The emitter doping level is advantageously selected such that the emitter/base p-n junction substantially has "backward diode" characteristics. For a discussion of the backward diode, see, for instance, S. M. Sze, "Physics of Semiconductor Devices", 2nd edition, Wiley & Sons (1981), pp. 537–539.

Devices according to the invention can, and typically will, be incorporated into integrated circuits, typically making possible simplification of the circuit.

DETAILED DESCRIPTION OF SOME EXEMPLARY EMBODIMENTS

Figure 1:
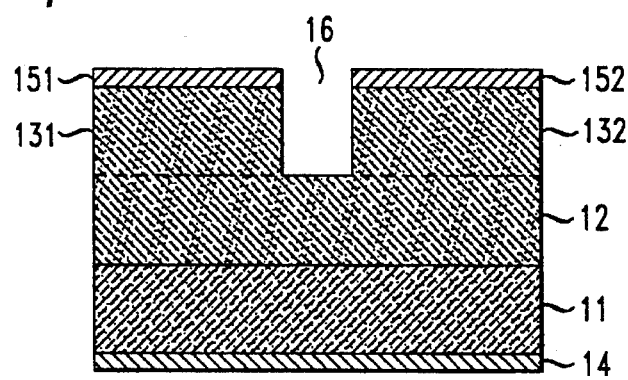
FIG. 1 schematically depicts an exemplary embodiment of the device.

FIG.1 schematically depicts an exemplary device according to the invention, wherein layers 11 and 12 are the collector layer and base layer, respectively. Numeral 14 refers to the collector contact, numerals 131 and 132 refer to emitter 1 and emitter 2, respectively, and 151 and 152 refer to the first and second emitter contact, respectively. Trench 16 separates emitter 1 and 2. Those skilled in the art will appreciate that electrical separation between emitters 1 and 2 can be achieved by means other than a trench, e.g., by means of oxidation or an isolation implant, with the emitter contacts serving as mask. Those skilled in the art will also appreciate that the layer structure typically will be disposed on a substrate, with the collector contact provided in any convenient manner, e.g., either on the back of the substrate or, preferably, in a trench that extends through emitter and base layer to the collector layer, analogous to the deep trench of FIG. 4 in the '687 patent.

The base/collector p-n junction can be conventional, with properties as frequently found in bipolar transistors. For instance, the junction typically is adapted for effectively extracting minority carriers that approach the junction from the base, and the junction typically is able to withstand substantial (e.g., a few volts) reverse bias without significant leakage.

Figure 2:
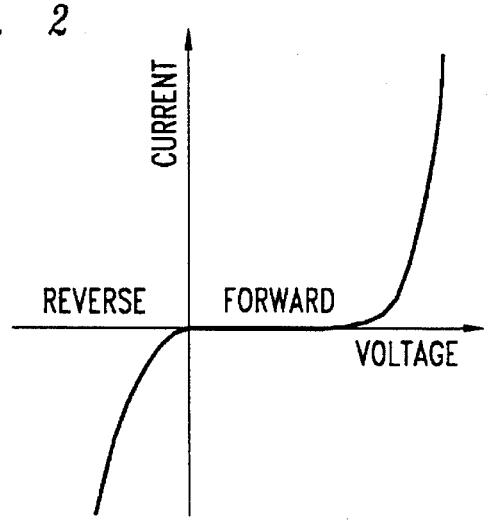
FIG. 2 shows the current-voltage charactersitic of an exemplary backward diode.

The emitter/base p-n junctions advantageously possess the current/voltage characteristics of a backward diode, as exemplified by FIG. 2. As can be seen from FIG. 2, such a diode can provide a low resistance majority carrier contact under reverse bias (e.g., due to Zener tunneling), while providing normal injection of minority carriers into the base when forward biased.

The invention can be embodied in devices with pseudomorphic $Si/Si_{1-x}Ge_x/Si$ layer structure ($0<x\leq 0.5$), but can also be embodied in III/V semiconductor structures, InAlAs/ GaAsSb/InAlAs on InP. As those skilled in the art will know, in these materials combinations most of the bandgap discontinuity falls in the valence band. This is an advantageous feature but is not a requirement. It is also not a requirement that collector layer and emitter layer have the same composition.

Next we will describe the operating principle of a device as shown in FIG. 1. If a reverse voltage V is applied to the collection contact, and if both emitter contacts are biased identically, with, e.g., $V_1=V_2=0$, then both emitter/base junctions pass a small current, characteristic of a bipolar transistor with a floating base. For V sufficiently large ($V \gg kT$, where k is Boltzmann's constant and T is the absolute temperature), the collector current is saturated. Most of the applied voltage drops in the collector/base junction, while both emitter/base junctions become biased by a small voltage $V_{eo}$ in the forward direction.

Next, assume that the emitter contacts are biased differently, e.g., $V_1=0$, and $V_2=\delta V$ is greater than the sum of $V_{eo}$ and the turn-on voltage of the backward diode, but less than or equal to V. The resulting lateral potential difference in the base layer gives rise to a current between the emitter terminals, corresponding to emitter 1 (the "injecting" emitter) biased in the forward direction and emitter 2 (the "contact" emitter) biased in the reverse direction. Under these conditions, the transistor output (the collector current) is "high", i.e., the transistor is "on". Of course, the transistor is also on if the inputs are reversed, i.e., if $V_1$ is "high" and $V_2$ is "low", and the transistor is also "off" if both inputs are "high". The device functionality thus corresponds to the XOR logic function.

Figure 3:
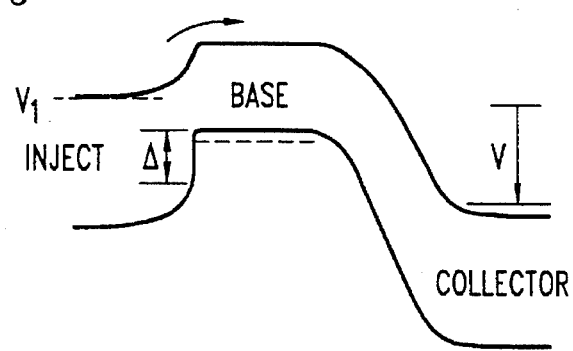
FIGS. 3 and 4 present the band diagrams of an exemplary device of the type shown in FIG. 1, for emitter voltages $V_1$ "low" and $V_2$ "high", with FIG. 3 pertaining to the "injecting" emitter (emitter 1), and FIG. 4 pertaining to the "contact" emitter (emitter 2)
Figure 4:
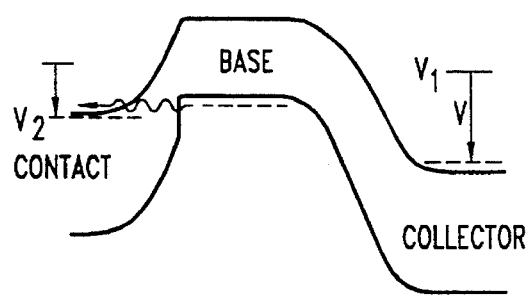

FIG. 3 shows the band diagram of the emitter 1 portion of the above described device, and FIG. 4 that of the emitter 2 portion of the device, for $V_1=0$, and $V_2$=high. A voltage $V \geq V_2$ is applied to the collector. The band structures correspond to those in a Si/GeSi/Si implementation of the device. As those skilled in the art know, when this strained layer system is pseudomorphic with the Si substrate then most of the bandgap discontinuity is taken by the valence band discontinuity Δ. This is a desirable characteristic for devices according to the invention. As is evident from FIG. 4, the quasi-classical tunneling probability is not significantly degraded by the presence of a finte Δ.

The emitter efficiency of the injecting contact is high even if the base doping is heavy, because the injection of holes is suppressed by a factor exp ($-\Delta/kT$). This permits implementations with a thin, highly conducting base. Such a base can also enhance the tunneling conductivity of the backward diode.

In preferred embodiments of the invention, the base/ emitter junctions have the following characteristics:

i) the backward diode reverse resistance and the base sheet resistance are relatively low, exemplarily less than $10^{-5} \Omega/cm^2$ and $1 k\Omega$/square, respectively;

ii) the junctions have high injection efficiency in the forward direction, i.e., hole injection into the emitter is substantially suppressed; and iii) the base is sufficiently thin to ensure a high transfer coefficient for minority carriers.

Exemplarily the invention is embodied in a device having the following structure.

On a conventional Si substrate are disposed in sequence, a 1 μm $n^+$ ($10^{18}/cm^2$b) Si collector contact layer, a 0.1 μm n ($10^{17}/cm^2$Sb) Si collector layer, a 10 nm graded $Ge_xSi_{1-x}$ (with x varying from zero to 0.2) ... layer, a 30 nm $p^+$ ($2\times 10^{19}/cm^2$B) $Ge_{0.28}Si_{0.8}$ base layer, a 50 nm $n^+$ ($2\times 10^{18}/cm^2$Sb)Si emitter layer, and a 150 nm $n^+$ ($2\times 10^{19}/cm^2$Sb) Si emitter contact layer.

The layer structure is formed by MBE, but can be formed by any other appropriate growth technique, e.g., CVD or, for III-V heterostructures, MOMBE. After completion of the layer growth the wafer is processed by conventional means into device structures. Exemplarily the emitter stripe is 2 gm wide and 10 gm long. The trench that separates emitter 1 from emitter 2 is 0.5 μm wide, extends the full length of the emitter stripe, and extends completely through emitter layer and emitter contact layer. Conventional metal contacts are provided to emitter 1, emitter 2 and the collector.

The device performs substantially as described above.

Figure 5:
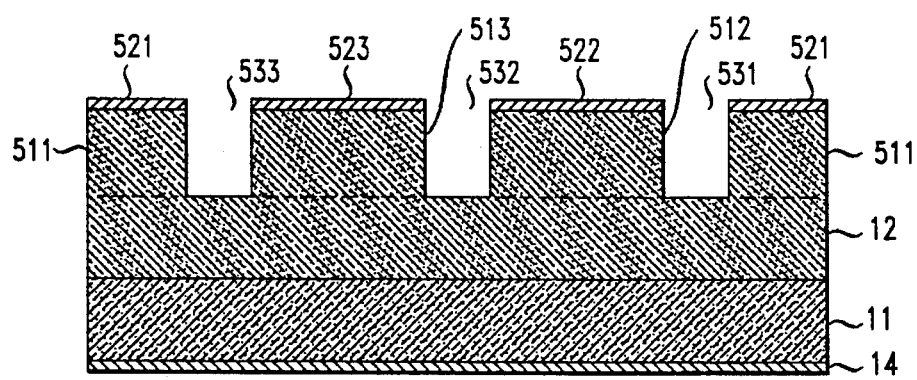
FIGS. 5 and 6 schematically depict a further exemplary embodiment of the invention that can advantageously serve as a logic element.
Figure 6:
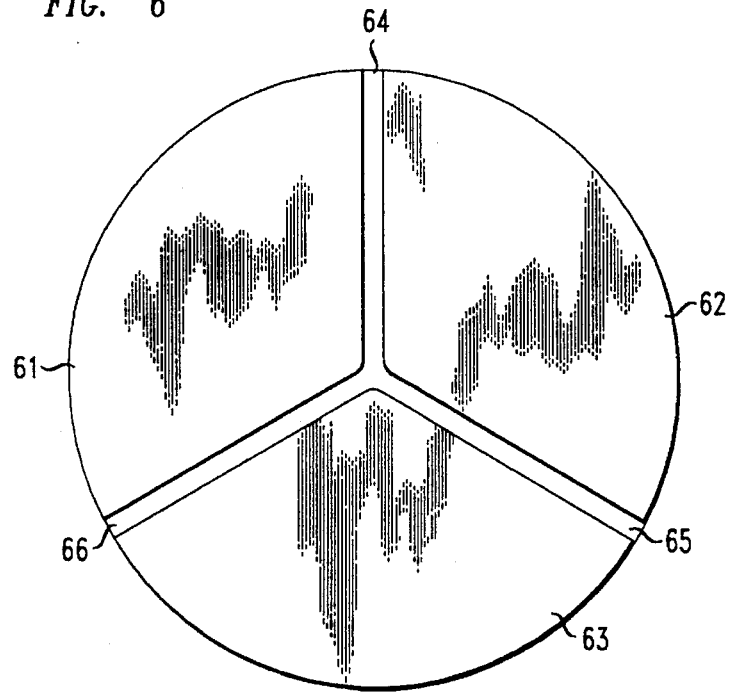

Devices according to the invention are not limited to the above described simple XOR structure, but instead can be implemented with more complex structures. FIG. 5 schematically shows the layer structure of an exemplary device with three emitter contacts (521, 522, 523) separated by trenches (531, 532, 533). FIG. 6 shows a currently preferred lay-out of the emitter contacts (61–63), with trenches (64–66) separating a given emitter from the other emitters.

The device of FIGS. 5 and 6 has $2^3=8$ logic states and can function as an ORNAND gate. The output current is "low" if either all inputs are "high" or all inputs are "low". In the remaining six states the output current is "high". This corresponds to the following Boolean function of three input voltages $V_j$, regarded as logic signals:

$$\text{ORNAND}(V_1, V_2, V_3) = \left[ \bigcup_{j=1}^{3} V_j \right] \cap \left[ \bigcup_{i=1}^{3} \overline{V_i} \right],$$

where the symbols ∩, ∪ and $\overline{A}$ stand for the logic functions AND, OR and NOT A, respectively, and the low/high values of the output current or input voltage is taken as Boolean 0/1.

The above equation generates the OR function of any two inputs when the third input is set "low", and generates the NAND function when the third input is set "high ".

It should be noted that the output current will not be the same in all "on" states even in a perfectly symmetric structure. Assuming that most of the input voltage difference δV drops across the injecting contact, the "on" states with two injecting and one contact emitter will generate about twice higher output current than the states with one injecting and two contact emitters. This characteristic of some devices according to the invention can be readily accommodated with known means, e.g., by adding a current limiter in series in the collector circuit.

The above described novel devices are expected to find use as logic gates in semiconductor logic circuits. However, the devices may also be advantageously used in digital or analog integrated circuits, where the absence of a base contact can lead to a simplified fabrication technology and allows a more compact disposition of the transistor elements.

We claim:

1. An article comprising a semiconductor electronic device comprising a semiconductor layer structure comprising, in sequence, a) a first layer of first composition semiconductor material that is doped to be a first conductivity type;

b) a second layer of second composition semiconductor material that is doped to be a second conductivity type, the second composition and conductivity type differing from the first composition and conductivity type, respectively;

c) a third layer of third composition semiconductor material that is doped to be the first conductivity type, the third composition differing from the second composition; and d) a first contact and a further contact for electrically contacting the first layer and the third layer, respectively;

Characterized in that e) the third layer comprises a first region that overlies a first portion of the second layer, and further comprises a second region that overlies a second portion of the second layer, said first region being essentially electrically isolated from said second region such that substantially no first conductivity type charge carriers can flow between said first and second regions without passing through second layer material;

f) the further contact comprises a first region contact disposed on the first region, and a second region contact disposed on the second region and not in direct contact with the first region contact;

g) said second layer is continuous between said first and second portions; and h) the device does not comprise a contact for electrically contacting the second layer.

2. An article according to claim 1, wherein a) the layer structure is disposed on a Si substrate, with the first layer being a Si layer, and the second layer comprising $Ge_xSi_{1-x}$ layer, with $x<0.5$; or b) the layer structure is disposed on a InP substrate, with the first layer being a InAlAs layer, and the second layer comprising GaAsSb.

3. An article according to claim 1, wherein the first conductivity type is n-type.

4. An article according to claim 1, wherein the first region of the third layer is electrically isolated from the second region of the third layer by a trench that extends through the third layer to the second layer.

5. An article according to claim 1, wherein the first region of the third layer is electrically isolated from the second region of the third layer by dielectric material that extends through the third layer to the second layer.

6. An article according to claim 5, wherein the dielectric material is $SiO_2$.

7. An article according to claim 1, wherein the second and third layers are doped such that said two layers form a p-n junction substantially having backward diode characteristics.

8. An article according to claim 7, further comprising means for providing electrical bias to the first contact, first region contact and second region contact, respectively.

9. Article according to claim 8, wherein the article is an integrated circuit.

10. Article according to claim 1, wherein the third layer comprises at least a third region that is electrically isolated from the first region and the second region such that substantially no first conductivity type charge carriers can flow between said third region and said first and second regions, respectively, without passing through second layer material.

11. Article according to claim 1, wherein the third composition is essentially the same as the first composition.

* * * * *